(12) United States Patent
Lee et al.

(10) Patent No.: US 9,048,276 B2
(45) Date of Patent: Jun. 2, 2015

(54) MATCHED COEFFICIENT OF THERMAL EXPANSION FOR AN ELECTROSTATIC CHUCK

(75) Inventors: William D. Lee, Newburyport, MA (US); Ashwin M. Purohit, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1042 days.

(21) Appl. No.: 13/116,732

(22) Filed: May 26, 2011

(65) Prior Publication Data

US 2011/0292562 A1    Dec. 1, 2011

Related U.S. Application Data

(60) Provisional application No. 61/349,552, filed on May 28, 2010.

(51) Int. Cl.
| | |
|---|---|
| *B23B 31/28* | (2006.01) |
| *H01L 21/687* | (2006.01) |
| *H01L 21/683* | (2006.01) |
| *H01L 21/67* | (2006.01) |

(52) U.S. Cl.
CPC ........ *H01L 21/6831* (2013.01); *Y10T 29/49117* (2013.01); *Y10T 279/23* (2013.01); *B23B 31/28* (2013.01); *H01L 21/6833* (2013.01); *H01L 21/67103* (2013.01)

(58) Field of Classification Search
CPC .... B23B 31/28; H01L 21/6833; Y10T 279/23
USPC .......................................... 279/128; 361/234
IPC ......................................................... B23B 31/28
See application file for complete search history.

(56) References Cited

U.S. PATENT DOCUMENTS

| | | | |
|---|---|---|---|
| 6,327,855 B1 * | 12/2001 | Hill et al. .......................... | 60/528 |
| 6,535,371 B1 * | 3/2003 | Kayamoto et al. ............. | 361/234 |
| 7,220,319 B2 * | 5/2007 | Sago et al. ..................... | 118/725 |
| 7,560,705 B2 | 7/2009 | Eiriksson et al. | |
| RE42,175 E * | 3/2011 | Sago et al. ..................... | 118/725 |
| 8,105,457 B2 * | 1/2012 | Van Elp ....................... | 156/274.4 |
| 8,194,384 B2 * | 6/2012 | Nasman et al. ................ | 361/234 |
| 2006/0051602 A1 * | 3/2006 | Iacovangelo et al. .......... | 428/472 |
| 2007/0169703 A1 * | 7/2007 | Elliot et al. ................... | 118/728 |
| 2009/0305489 A1 * | 12/2009 | Fish ............................... | 438/514 |

(Continued)

OTHER PUBLICATIONS

U.S. Appl. No. 12/725,508, filed Mar. 17, 2010. 21 Pages.

*Primary Examiner* — Eric A Gates
(74) *Attorney, Agent, or Firm* — Eschweiler & Associates, LLC

(57) ABSTRACT

An apparatus and method are provided for selecting materials for forming an electrostatic clamp. The electrostatic clamp has a backing plate having a first coefficient of thermal expansion, wherein the backing plate provides structural support and rigidity to the electrostatic clamp. The electrostatic clamp further has a clamping plate having a clamping surface associated with contact with a workpiece, wherein the clamping plate has a second coefficient of thermal expansion associated therewith. The clamping plate is bonded, attached or grown to the backing plate, wherein minimal deflection of the clamping plate is evident across a predetermined temperature range. The first coefficient of thermal expansion and second coefficient of thermal expansion, for example, are substantially similar, and vary by no greater than a factor of three.

12 Claims, 5 Drawing Sheets

(56) References Cited

U.S. PATENT DOCUMENTS

| | | | |
|---|---|---|---|
| 2011/0211178 A1* | 9/2011 | Sogard et al. | 355/30 |
| 2012/0273162 A1* | 11/2012 | Mahadeswaraswamy | 165/61 |
| 2013/0081796 A1* | 4/2013 | Horiuchi et al. | 165/185 |
| 2013/0200496 A1* | 8/2013 | Murali et al. | 257/618 |
| 2013/0200497 A1* | 8/2013 | Murali et al. | 257/618 |
| 2013/0220988 A1* | 8/2013 | Kondo et al. | 219/444.1 |
| 2013/0228565 A1* | 9/2013 | Kondo et al. | 219/538 |
| 2013/0228566 A1* | 9/2013 | Kondo et al. | 219/540 |
| 2013/0229746 A1* | 9/2013 | Aikawa et al. | 361/234 |
| 2013/0250471 A1* | 9/2013 | Rex | 361/234 |

\* cited by examiner ated Application Ser. No. 61/349,552 which was filed
MATCHED COEFFICIENT OF THERMAL EXPANSION FOR AN ELECTROSTATIC CHUCK

REFERENCE TO RELATED APPLICATION

This application claims priority to and the benefit of U.S. Provisional Application Ser. No. 61/349,552 which was filed May 28, 2010, entitled "MATCHED COEFFICIENT OF THERMAL EXPANSION FOR AN ELECTROSTATIC CHUCK", the entirety of which is hereby incorporated by reference as if fully set forth herein.

FIELD OF THE INVENTION

The present invention relates generally to ion implantation systems, and more specifically to matching a coefficient of thermal expansion of components of an electrostatic chuck.

BACKGROUND OF THE INVENTION

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode or backing plate, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the chuck surface by electrostatic forces.

At colder temperatures, the mismatch of coefficients of thermal expansion (CTE) between the dielectric layer and the backing plate can cause significant deformation in the surface of the ESC. Among other problems, this deformation leads to potential leakage of backside gas, and further reduces wafer handling reliability.

Therefore, a need exists in the art for an improved electrostatic clamp wherein deformation of the clamp is minimized over a predetermined temperature range.

SUMMARY OF THE INVENTION

The present invention overcomes the limitations of the prior art by providing a system, apparatus, and method for clamping workpieces in a semiconductor processing system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an apparatus and method for selecting materials for forming an electrostatic clamp. The electrostatic clamp comprises a backing plate having a first coefficient of thermal expansion associated therewith, wherein the backing plate provides structural support and rigidity to the electrostatic clamp. The electrostatic clamp further comprises a clamping plate having a clamping surface associated with contact with the workpiece, wherein the clamping plate has a second coefficient of thermal expansion associated therewith. In accordance with the invention, the clamping plate is bonded to the backing plate, wherein minimal deflection of the clamping plate is evident across a predetermined temperature range. The first coefficient of thermal expansion and second coefficient of thermal expansion, for example, are substantially similar, and vary by no greater than a factor two or three.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
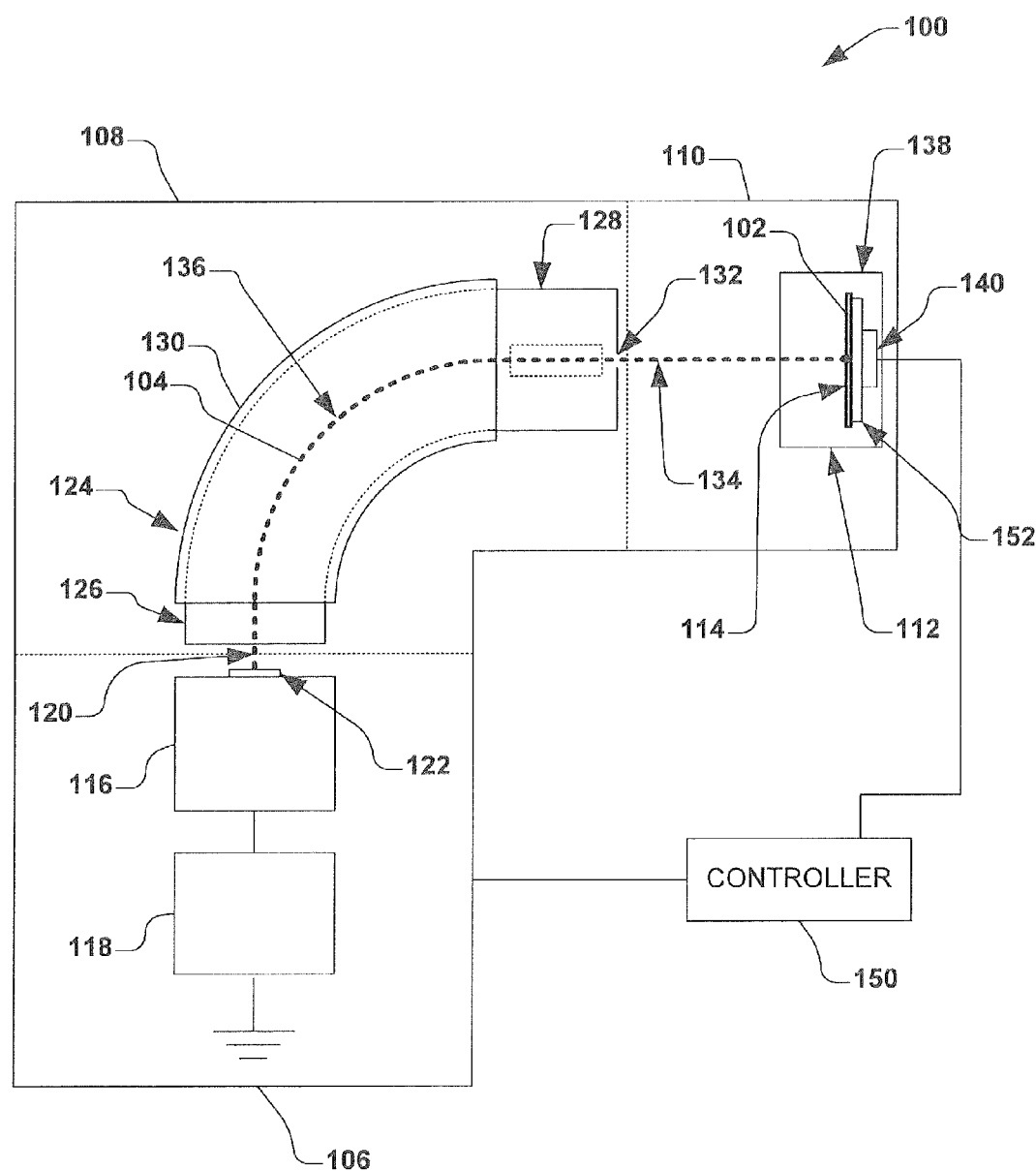
FIG. 1 is a block diagram of an exemplary ion implantation system according to one aspect of the disclosure.

The present invention is directed generally toward an electrostatic clamp or chuck (ESC) that provides improved clamping and thermal uniformity by closely matching the coefficients of thermal expansions of a ceramic and a metal backing plate, therein mitigating warping of the chuck, and wherein the chuck performs more reliably over a large range of temperatures. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or wafer) relative to an ion beam 104, therein implanting ions into the workpiece. As stated above, various aspects of the present invention may be implemented in association with any type of ion implantation apparatus, including, but not limited, to the exemplary system 100 of FIG. 1. The exemplary ion implantation system 100 comprises a terminal 106, a beamline assembly 108, and an end station 110 that generally forms a process chamber 112, wherein the ion beam 104 is generally directed at the workpiece 102 positioned at a workpiece location 114. An ion source 116 in the terminal 106 is powered by a power supply 118 to provide an extracted ion beam 120 (e.g., an undifferentiated ion beam) to the beamline assembly 108, wherein the ion source comprises one or more extraction electrodes 122 to extract ions from the source chamber and thereby to direct the extracted ion beam toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 120 and creates a dipole magnetic field to pass only ions of appropriate energy-to-mass ratio or range thereof through a resolving aperture 132 to the workpiece 102. The ions passed through the mass analyzer 130 and exit the resolving aperture 132 generally define a mass analyzed or desired ion beam 134 having ions of the desired energy-to-mass ratio or range thereof. Various beam forming and shaping structures (not shown) associated with the beamline assembly 108 may be further provided to maintain and bound the ion beam 104 when the ion beam is transported along a desired beam path 136 to the workpiece 102.

In one example, the desired ion beam 134 is directed toward the workpiece 102, wherein the workpiece is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor wafer, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. It should be noted, however, that batch or other type end stations may alternatively be employed, wherein multiple workpieces 102 may be scanned simultaneously, and such end stations are contemplated as falling within the scope of the present invention.

In another example, the system 100 may comprise an electrostatic beam scanning system (not shown) operable to scan the ion beam 104 along one or more scan planes relative to the workpiece 102. The workpiece 102, for example, can thus be stationary or translated by the workpiece scanning system 138. Accordingly, the present invention contemplates any scanned or non-scanned ion beam 104 as falling within the scope of the present invention. In accordance with one embodiment of the present invention, the workpiece scanning system 138 of FIG. 1 comprises a scan arm 140, wherein the scan arm is configured to reciprocally scan the workpiece 102 with respect to the ion beam 104. The ion implantation system 100, for example, is further controlled by a controller 150, wherein functionality of the ion implantation system and workpiece scanning system 138 is controlled via the controller.

In accordance with one exemplary aspect, an electrostatic clamp (also called an electrostatic chuck or ESC) 152 is utilized to electrostatically hold or clamp the workpiece 102 thereto during the ion implantation. An insulating layer 154 (e.g., a dielectric layer) on a surface 156 of the ESC 152 generally permits a capacitance to build between the workpiece 102 and an electrode 158 in the ESC. The electrode 158 is generally encapsulated in a ceramic layer 160, wherein the ceramic layer is mounted, bonded, attached or grown onto a backing plate 162, wherein the backing plate provides a structural rigidity to the ESC 152, as well as providing cooling of the ESC by running a coolant through channels 163 in the backing plate.

In one particular example, the ESC 152 is formed by mounting a ceramic layer (e.g., aluminum nitride) to a metal layer (e.g., an aluminum disc). When operated at the temperature at which the ESC 152 is formed or manufactured, such as room temperature when ceramic layer is mounted to the metal layer via an adhesive or other process, the surface 156 of the ESC generally remains flat or planar. However, the inventors presently appreciated that when the temperature of the ESC 152 is increased or decreased from the temperature at which it was formed, the coefficients of thermal expansion (CTE) of the differing materials (e.g., the insulating layer 154, ceramic layer 160, and backing plate 162) comprising the ESC becomes important. In general, ceramics have a lower CTE than metals. Aluminum nitride, for example, has CTE of ~4.2, whereas aluminum has CTE of ~23. When the ESC 152 is chilled or heated, for example, the two materials will shrink at different rates, causing the ESC to deform, as illustrated in the examples of FIGS. 3A-3B.

Figure 3A:
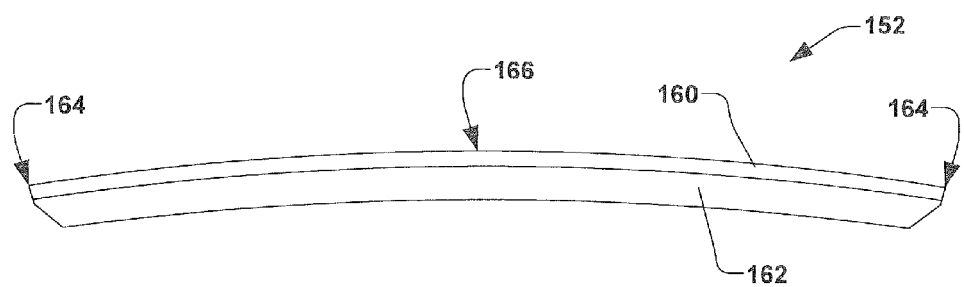
FIGS. 3A-3B illustrate electrostatic chuck deformation according to another exemplary aspect of the disclosure.
Figure 3B:
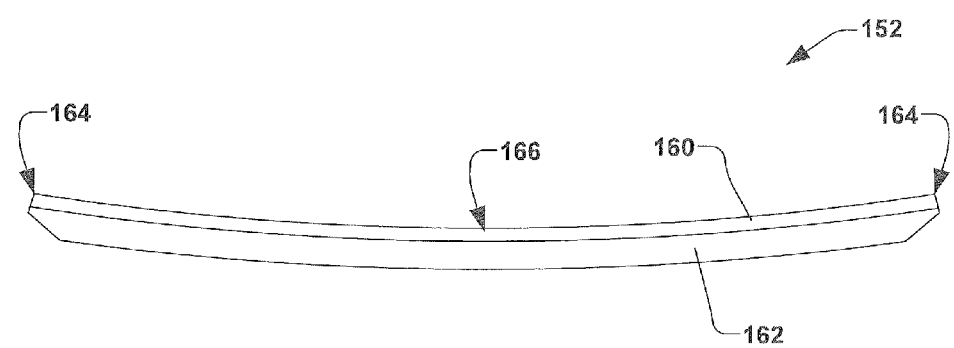

For example, models indicate that when cooling the ESC 152 at a −60° C. processing temperature, thus providing a change in temperature (ΔT) from ambient of approximately 80° C., the difference in the CTEs of the materials comprising the ceramic layer 160 and the backing plate 162 cause the ESC to deform convexly, as illustrated in FIG. 3A. According to the model results shown in FIG. 3A, an edge 164 of the ESC 152 is approximately 1 mm out of plane with a center 166 of the chuck. Further models indicate that when heating the ESC 152 to a +70° C. processing temperature, with a ΔT=50° C., the difference between CTEs of the materials of the ceramic layer 160 and the backing plate 162 cause the chuck to deform concavely, as illustrated in FIG. 3B. According to the model of FIG. 3B, the edge 164 is about 0.7 mm out of plane with the center 166 of the chuck 152.

In the above example, the backing plate 162 electrostatic chuck 152 was comprised of aluminum alloy, wherein the ceramic layer 160 comprised of aluminum nitride was bonded to the backing plate. As seen in the examples of FIGS. 3A and 3B, mismatching in coefficients of thermal expansion between aluminum alloy and aluminum nitride provides significant warpage of the electrostatic clamp 152 over large temperature changes.

Thus, in accordance with the present invention, the inventors appreciate that matching the CTEs of the materials used in a multi-material electrostatic clamp 152 (e.g., the ceramic layer 160 and backing plate 162) greatly reduces the thermal deformation of the ESC. Aluminum nitride (AlN), for example, has a CTE of about 4.2 µm/m K, while aluminum metal in its elemental form has a CTE of about 23.1 µm/m K. Thus, a mating of the ceramic layer 160 comprising aluminum nitride with a backing plate 162 comprising aluminum causes a large CTE difference and gives rise to the deformation illustrated in FIGS. 3A-3B. A material for the backing plate 162 that is quite well matched to a ceramic layer 160 comprised of AlN, in regards to CTE, is silicon carbide, SiC. Manufacturing a backing plate 162 for an electrostatic chuck 152 from SiC is expensive, however. An acceptable match of CTE for the backing plate 162 to a ceramic layer 160 comprised of AlN, which provides minimal deformation over a predetermined temperature range (e.g., ΔT=50–80° C.), for example, is titanium, having a CTE of approximately 8.6 μm/m K.

Figure 2:
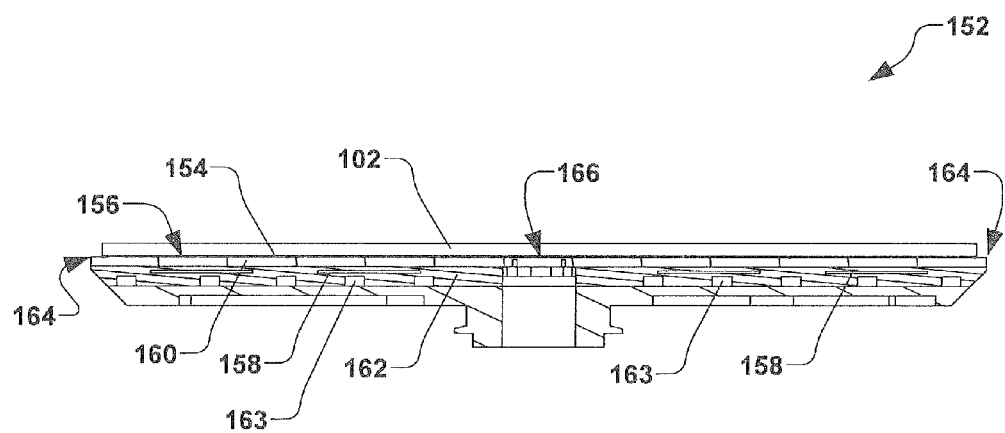
FIG. 2 illustrates an exemplary electrostatic chuck in accordance with another aspect of the disclosure.
Figure 4A:
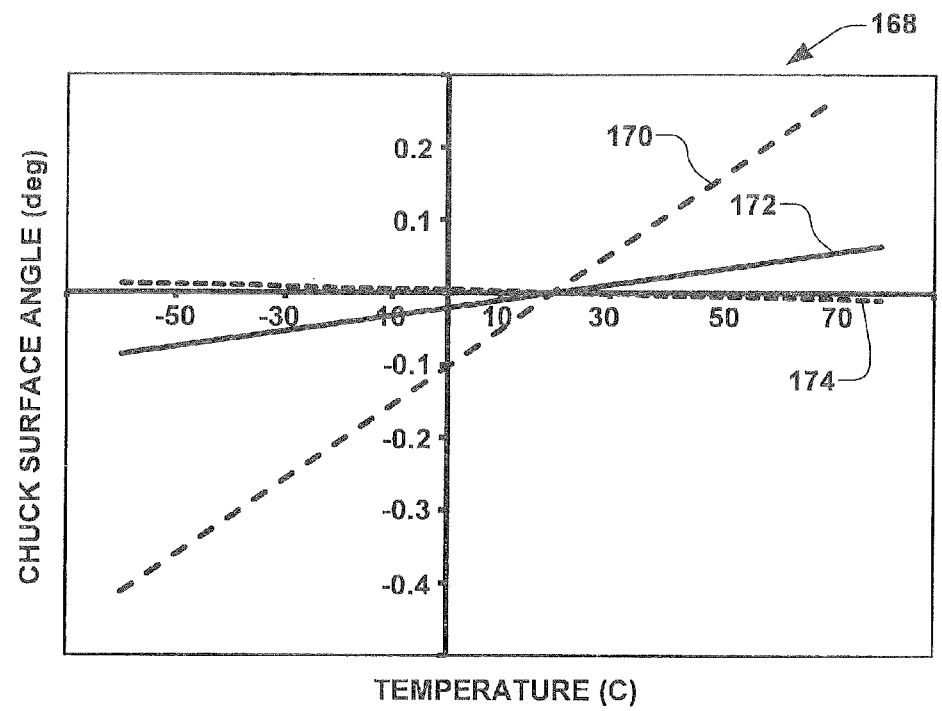
FIGS. 4A-4B are graphs illustrating angular and linear deflection of a chuck having differing coefficients of thermal expansion according to still another exemplary aspect of the disclosure.
Figure 4B:
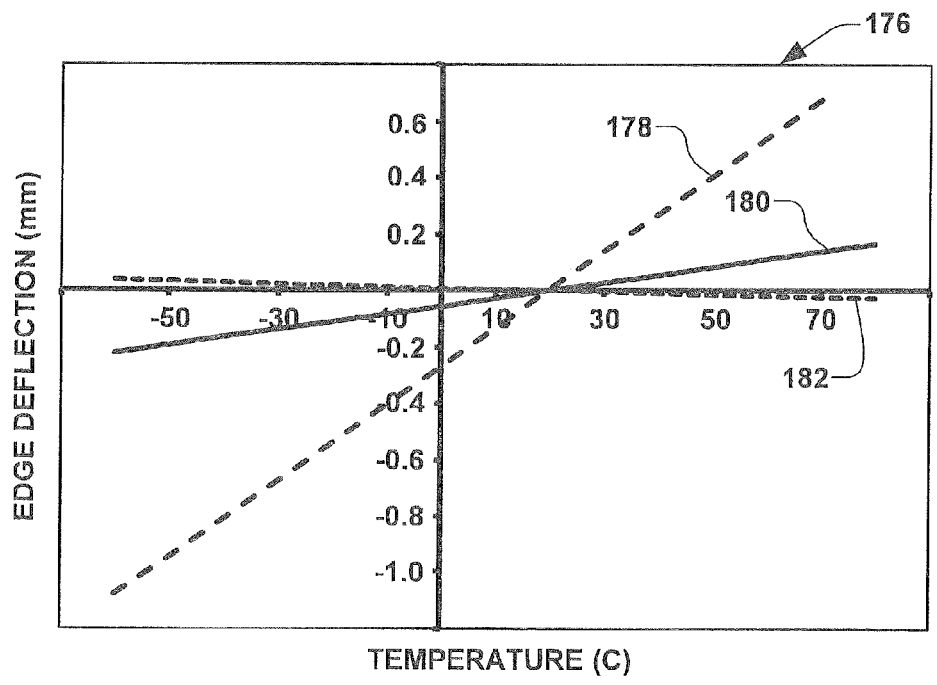

FIG. 4A, for example, illustrates a graph 168 showing a surface angle deflection of the edge 164 with respect to the center 166 of the ESC 152 of FIG. 2. Respective curves 170, 172, and 174 associated with aluminum, titanium, and silicon carbide backing plates across the predetermined temperature range are shown. FIG. 4B illustrates a graph 176 showing linear vertical deflection of the edge 164 with respect to the center 166 of the ESC 152 of FIG. 2, and respective curves 178, 180, and 182 illustrated the deflection likewise associated with aluminum, titanium, and silicon carbide across the predetermined temperature range.

As can be seen in FIG. 4A, the curve 170 associated with aluminum shows that aluminum exhibits a relatively large amount of angular deflection, as well as linear deflection of the edge exhibited in curve 178 of FIG. 4B. By having such a large deflection, the workpiece of FIG. 2, for example, is not properly held to the surface 156 of the ESC 152. Furthermore, in an ion implantation process, wherein angular orientation of the ion beam 134 of FIG. 1 with respect to the workpiece 102 is often important, the approximately one degree of variation in angle of implant across workpiece shown in FIG. 4A associated with the aluminum curve 170 can prove deleterious. Internal stresses of the workpiece 102 can further lift the workpiece off the edge 164 of the ESC 152 of FIG. 2 if insufficient clamping force is provided, thus decreasing the holding force at the edge, and a potential leaking of backside gases into the process chamber 138 of FIG. 1.

Other considerations, for example, are also taken into consideration in selecting the material for the backing plate 162 and ceramic layer 160, such as material cost, machinability, and weight of the respective materials. Molybdenum, for example, provides a close match of CTE to aluminum nitride of the ceramic layer 160, but molybdenum is relatively heavy, and is further difficult to machine. Furthermore, the inventors appreciate that nickel-based materials are deleterious to ion implantation systems, as nickel often causes problems with contamination in the end station 110 of FIG. 1. Other materials such as Invar and Kovar have well matched CTEs to aluminum nitride, but may be less desirable due to possible nickel contamination. Thus, secondary design criteria considerations such as weight, density, strength, and thermal conductivity are taken. Titanium, for example, is advantageous in cold or chilled ion implantations (e.g., −50° C.), as titanium provides a relative insulative property for a cold implant. Thus, compared to aluminum, titanium limits an amount of heat transferring from the scan arm 140 to the workpiece 102.

In particular, the combination of the selection of alumina ($Al_2O_3$, also called aluminum oxide) for the ceramic layer 160 with titanium (Ti) and/or alloys of titanium for the backing plate 162 are advantageous, according to the present invention. For example, the CTE for alumina can range from 7.0 μm/m ° C. to 8.8 μm/m ° C., thus closely matching the CTE for titanium, which has a CTE=8.6 μm/m° C. Further, the combination of aluminum nitride (AlN) and titanium and/or alloys of titanium are also advantageous, as the CTEs of these materials also closely match one another. The CTE of SiC is also relatively closely matched to aluminum nitride. Other materials and their respective CTEs are as follows:

Aluminum and alloys of aluminum: 21-25 μm/m K
Titanium and alloys of titanium: 9-13 μm/m K
Martensitic stainless steel: 10-12 μm/m K
Nitride steels: 12 μm/m K
Ferritic stainless steel: 10-11 μm/m K
Low expansion nickel alloys: 3-10 μm/m K
Alumina Cermets: 8-9 μm/m K
Platinum: 9 μm/m K
Vanadium: 9 μm/m K
Titanium carbide: 7 μm/m K
Alumina carbide: 7 μm/m K
Alumina ceramics: 6-7 μm/m K
Tungsten: 4 μm/m K Thus, the inventors appreciate that by selecting a material for backing plate 162 that has a CTE that matches or is relatively close (e.g., varying by no greater than factor of 2 or 3) to the CTE of the ceramic layer 160, problems such as cracking of the workpiece 102, undesirable lack of clamping force to the workpiece, and unacceptable angular variations in the resulting ion implantation are mitigated. A maximum difference in CTEs between the ceramic layer 160 and backing plate 162, for example, is further determined by the geometry and/or size of the electrostatic clamp 152.

Figure 5:
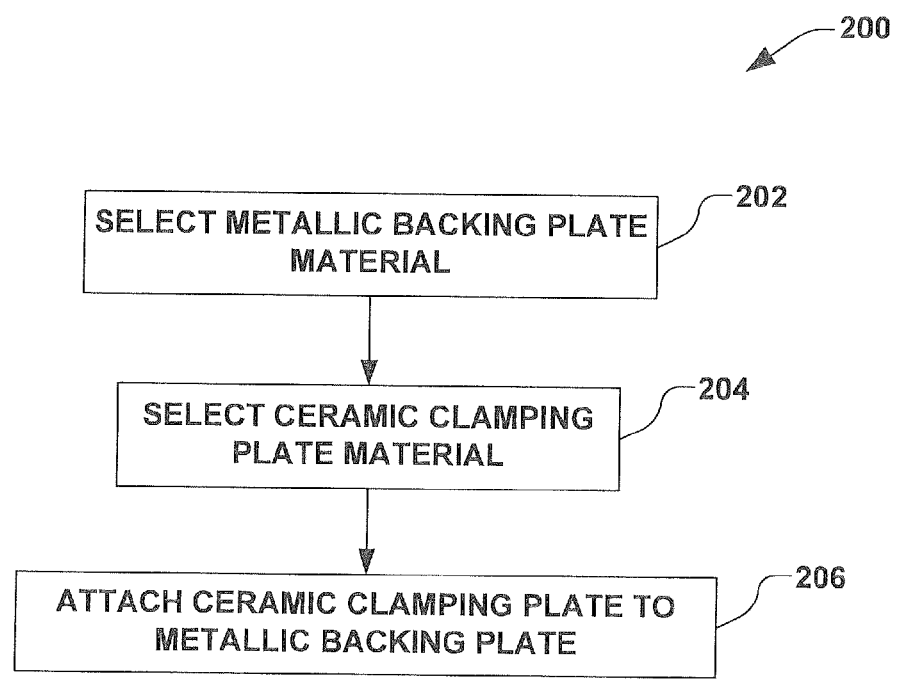
FIG. 5 is a flowchart illustrating an exemplary method for selecting materials for an electrostatic chuck having similar coefficients of thermal expansion.

FIG. 5 illustrates an exemplary method 200 for manufacturing an electrostatic clamp, such as the electrostatic clamp 152 of FIGS. 1, 2, and 3A-3B. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 5 begins at act 202, wherein a metallic backing plate material is selected, wherein the metallic backing plate material has a first coefficient of thermal expansion associated therewith. In act 204, a ceramic clamping plate material is selected, wherein the ceramic clamping plate material has a second coefficient of thermal expansion associated therewith, and wherein the first coefficient of thermal expansion and second coefficient of thermal expansion are minimized, with a maximum difference determined by the geometry of the electrostatic clamp. The first coefficient of thermal expansion and second coefficient of thermal expansion, for example, vary by no greater than factor of three. According to one example, the selection of the metallic backing plate material and the ceramic clamping plate material is based on a predetermined temperature range in which the electrostatic clamp is configured to operate. In act 206, the ceramic clamping plate is bonded, attached, or grown on to the backing plate, therein defining the electrostatic clamp.

Accordingly, the present invention provides an electrostatic chuck that provides improved thermal uniformities. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic clamp for selectively maintaining a position of a workpiece, the electrostatic clamp comprising:
    a backing plate for providing structural support and rigidity to the electrostatic clamp, wherein the backing plate has a first coefficient of thermal expansion associated therewith, wherein the backing plate consists of a metal, therein defining a metallic backing plate; and
    a clamping plate having a clamping surface configured to contact the workpiece, wherein the clamping plate has a second coefficient of thermal expansion associated therewith, wherein the clamping plate comprises a ceramic material, therein defining a ceramic clamping plate, wherein the clamping plate is bonded to the backing plate, and wherein the first coefficient of thermal expansion and second coefficient of thermal expansion are minimized, with a maximum difference determined by the geometry of the electrostatic clamp.

2. The electrostatic clamp of claim 1, wherein the metallic backing plate is comprised of titanium, and wherein the ceramic clamping plate is comprised of aluminum nitride.

3. The electrostatic clamp of claim 1, wherein the metallic backing plate is comprised of titanium, and wherein the ceramic clamping plate is comprised of aluminum oxide.

4. The electrostatic clamp of claim 1, wherein the backing plate comprises one or more coolant channels configured to circulate a coolant fluid therethrough, therein controlling a temperature of the electrostatic clamp.

5. The electrostatic clamp of claim 1, wherein the metal consists of one or more of aluminum, titanium, platinum, and vanadium.

6. An electrostatic clamp for selectively maintaining a position of a workpiece, the electrostatic clamp comprising:
    a backing plate for providing structural support and rigidity to the electrostatic clamp, wherein the backing plate has a first coefficient of thermal expansion associated therewith, and wherein the backing plate consists of silicon carbide; and
    a clamping plate having a clamping surface configured to contact the workpiece, wherein the clamping plate has a second coefficient of thermal expansion associated therewith, wherein the ceramic clamping plate consists of aluminum nitride, wherein the clamping plate is bonded to the backing plate, and wherein the first coefficient of thermal expansion and second coefficient of thermal expansion are minimized, with a maximum difference determined by the geometry of the electrostatic clamp.

7. A method for manufacturing an electrostatic clamp, the method comprising:
    selecting a metallic backing plate material, wherein the metallic backing plate material consists of a metal having a first coefficient of thermal expansion;
    selecting a ceramic clamping plate material having a second coefficient of thermal expansion, wherein the first coefficient of thermal expansion and second coefficient of thermal expansion are minimized, with a maximum difference determined by the geometry of the electrostatic clamp; and
    forming a backing plate and clamping plate by bonding, attaching, or growing the ceramic clamping plate material on to the backing plate material.

8. The method of claim 7, wherein the selection of the metallic backing plate material and the ceramic clamping plate material is based on a predetermined temperature range in which the electrostatic clamp is configured to operate.

9. The method of claim 7, wherein the first coefficient of thermal expansion and second coefficient of thermal expansion vary by no greater than factor of three.

10. The electrostatic clamp of claim 7, wherein the metal consists of one or more of aluminum, titanium, platinum, and vanadium.

11. An electrostatic clamp for selectively maintaining a position of a workpiece, the electrostatic clamp comprising:
    a backing plate for providing structural support and rigidity to the electrostatic clamp, the backing plate consisting of a metal having a first coefficient of thermal expansion associated therewith;
    a clamping plate for providing a clamping surface to selectively contact the workpiece, the clamping plate having a second coefficient of thermal expansion associated therewith, wherein the clamping plate is bonded, attached or grown on to the backing plate, and wherein a difference between the first coefficient of thermal expansion and second coefficient of thermal expansion is minimized with a maximum difference determined by the geometry of the electrostatic clamp.

12. The electrostatic clamp of claim 11, wherein the metal consists of one or more of aluminum, titanium, platinum, and vanadium.

\* \* \* \* \*